United States Patent
Lai

(10) Patent No.: US 8,159,443 B2
(45) Date of Patent: Apr. 17, 2012

(54) DISPLAY PANELS

(75) Inventor: Ming-Sheng Lai, Taipei (TW)

(73) Assignee: AU Optronics Corp., Hsinchu (TW)

( * ) Notice: Subject to any disclaimer, the term of this patent is extended or adjusted under 35 U.S.C. 154(b) by 1069 days.

(21) Appl. No.: 11/181,469

(22) Filed: Jul. 14, 2005

(65) Prior Publication Data

US 2006/0279510 A1    Dec. 14, 2006

(30) Foreign Application Priority Data

Jun. 13, 2005 (TW) .............................. 94119479 A

(51) Int. Cl.
    *G09G 3/36* (2006.01)
(52) U.S. Cl. .............. 345/100; 345/98; 345/99; 345/87; 345/55
(58) Field of Classification Search .................. 345/104, 345/55–73, 99–100
    See application file for complete search history.

(56) References Cited

U.S. PATENT DOCUMENTS

| 5,774,100 | A  | * | 6/1998  | Aoki et al. ...................... 345/87 |
| 5,909,035 | A  |   | 6/1999  | Kim |
| 5,936,687 | A  | * | 8/1999  | Lee ................................. 349/40 |
| 7,123,230 | B2 | * | 10/2006 | Park et al. ....................... 345/92 |
| 7,429,970 | B2 | * | 9/2008  | Tsai et al. ....................... 345/87 |
| 2005/0128665 | A1 | * | 6/2005 | Roohparvar .................... 361/56 |
| 2005/0134546 | A1 | * | 6/2005 | Woo et al. ..................... 345/100 |
| 2006/0145951 | A1 | * | 7/2006 | Watanabe et al. ............... 345/55 |

* cited by examiner

*Primary Examiner* — Alexander Eisen
*Assistant Examiner* — Christopher E Leiby
(74) *Attorney, Agent, or Firm* — Thomas|Kayden

(57) ABSTRACT

A display panel comprising a plurality of first and second signal lines, first and second detecting lines, a plurality of ESD protection circuits, and first and second common electrode lines. The first and second detecting lines are respectively coupled to the first signal lines and the second signal lines. Each ESD protection circuit is coupled to one of the first signal lines or one of the second signal lines. The first and second common electrode lines are respectively coupled to first and second voltage ports. Each first signal line is coupled to the first common electrode line through the corresponding ESD protection circuit. Each second signal line is coupled to the second common electrode line through the corresponding ESD protection circuit.

13 Claims, 5 Drawing Sheets

DISPLAY PANELS

BACKGROUND

The invention relates to a liquid crystal display panel, and in particular to a liquid crystal display panel with a test circuit.

FIG. 1 is a schematic diagram of a display array of a conventional liquid crystal display (LCD) panel. As shown in FIG. 1, a display array 1, formed by interlacing data lines $D_1$ to $D_m$ and scan lines $G_1$ to $G_n$, is configured on a glass substrate and Each interlaced data line and scan line corresponds to one display unit, for example, interlaced data line $D_1$ and scan line $S_1$ correspond to display unit 100. As with any other display unit, the equivalent circuit of the display unit 100 comprises a switch transistor TFT, a storage capacitor Cs, and a liquid crystal capacitor Clc. A gate of the switch transistor is coupled to the scan line $G_1$, and a drain thereof is coupled to the data line $D_1$, and a source thereof is coupled to a pixel electrode PE.

After the display array of the LCD panel having the above-described configuration is formed, the glass substrate is tested to detect shorts and breaks in the data lines $D_1$ to $D_m$ and the scan lines $G_1$ to $G_n$. To complete these tests, a liquid crystal display (LCD) device for testing signal line disclosed in U.S. Pat. No. 6,566,902 B2, as shown in FIG. 2, comprises a plurality of data lines DL, an odd-numbered detecting line ODDL, and an even-numbered detecting line EDDL. The odd-numbered detecting line ODDL is commonly connected to odd-numbered data lines DL through data pads 2, and the even-numbered detecting line EDDL is commonly connected to even-numbered data lines DL through data pads 2. The LCD device provides two common electrode lines CLa and CLb arranged on the LCD device to cross each data line DL. The LCD also provides a plurality of electrostatic discharge (ESD) protection circuits 12, each connected between an odd-numbered data line and the common electrode line CLa and between an even-numbered data line and the common electrode line CLb. The LCD device further provides at least two auxiliary ESD protection circuits 14 connected in series between the two separated common electrode lines CLa and CLb. In this LCD device, one common voltage source Vcom provides voltage to both common electrode lines CLa and CLb. In a test process, test signals are applied to the odd-numbered detecting line ODDL and the even-numbered detecting line EDDL and then to the odd-numbered data lines and the even-numbered data lines, respectively, to thereby detect faults of the data lines DL, such as a short between two adjacent data lines DL. Similarly, the same test configuration is employed in the scan lines.

In the related art, the data lines DL are connected to the common electrode lines CLa or CLb through ESD protection circuits 12, which are further connected to the same common voltage source Vcom through auxiliary ESD protection circuits 14. Thus, the test signals on the odd-numbered detecting line ODDL and the even-numbered detecting line EDDL interfere with each other in a test process, resulting in an inaccurate test of signal lines.

SUMMARY

Display panels are provided. An exemplary embodiment of a display panel comprises a plurality of first signal lines, a plurality of second signal lines, a first detecting line, a second detecting line, a plurality of ESD protection circuits, a first common electrode line, and a second common electrode line. The second signal lines are alternately configured with the first signal lines. The first detecting line is coupled to the first signal lines. The second detecting line is coupled to the second signal lines. Each ESD protection circuit is coupled to one of the first signal lines or one of the second signal lines. The first common electrode line is coupled to a first voltage port. The second common electrode line is coupled to a second voltage port. Each first signal line is coupled to the first common electrode line through the corresponding ESD protection circuit. Each second signal line is coupled to the second common electrode line through the corresponding ESD protection circuit.

In some embodiments, a first impedance element is coupled between the first common electrode line and the first voltage port. A second impedance element is coupled between the second common electrode line and the second voltage port. The first and second signal lines can be data lines or scan lines.

DESCRIPTION OF THE DRAWINGS

The invention will become more fully understood from the detailed description given hereinbelow and the accompanying drawings, given by way of illustration only and thus not intended to be limitative of the invention.

DETAILED DESCRIPTION

Figure 1:
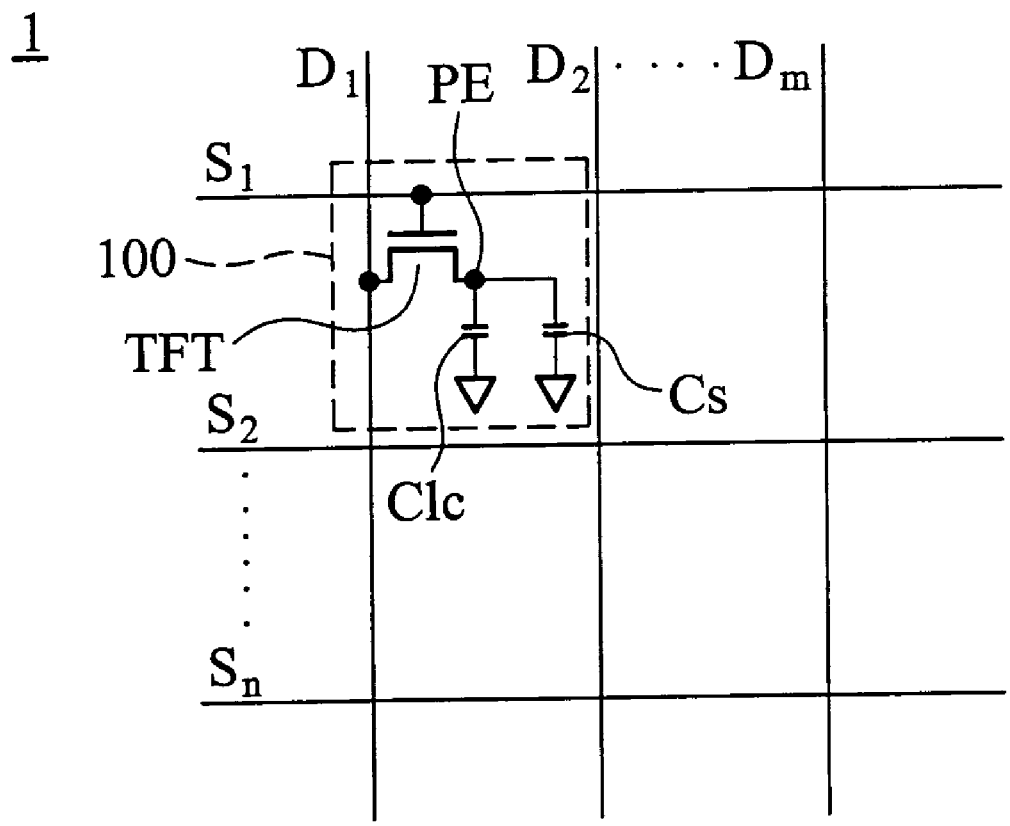
FIG. 1 shows a conventional display array of a LCD panel.
Figure 2:
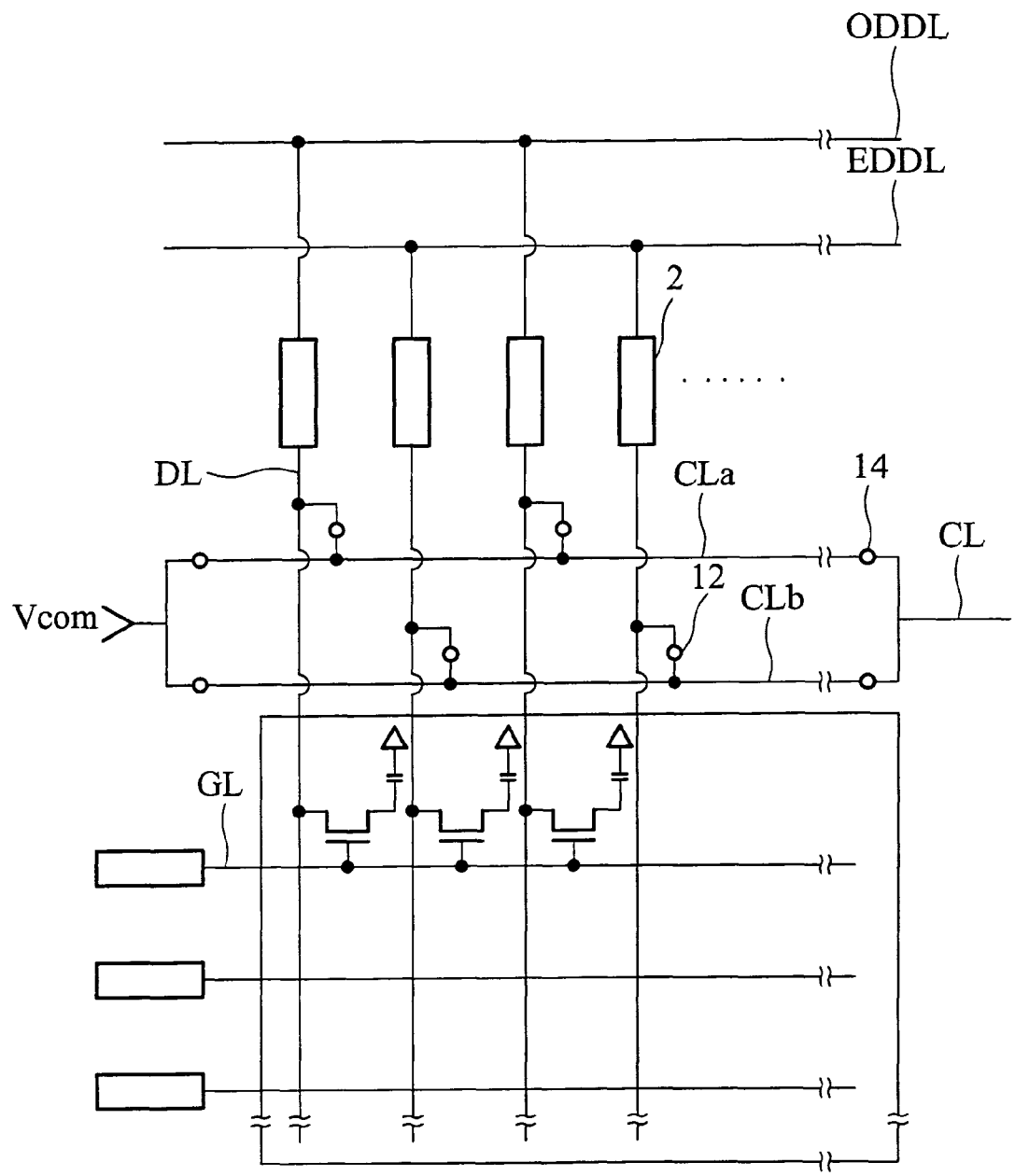
FIG. 2 shows a LCD device for testing signal line disclosed in U.S. Pat. No. 6,566,902 B2.
Figure 3:
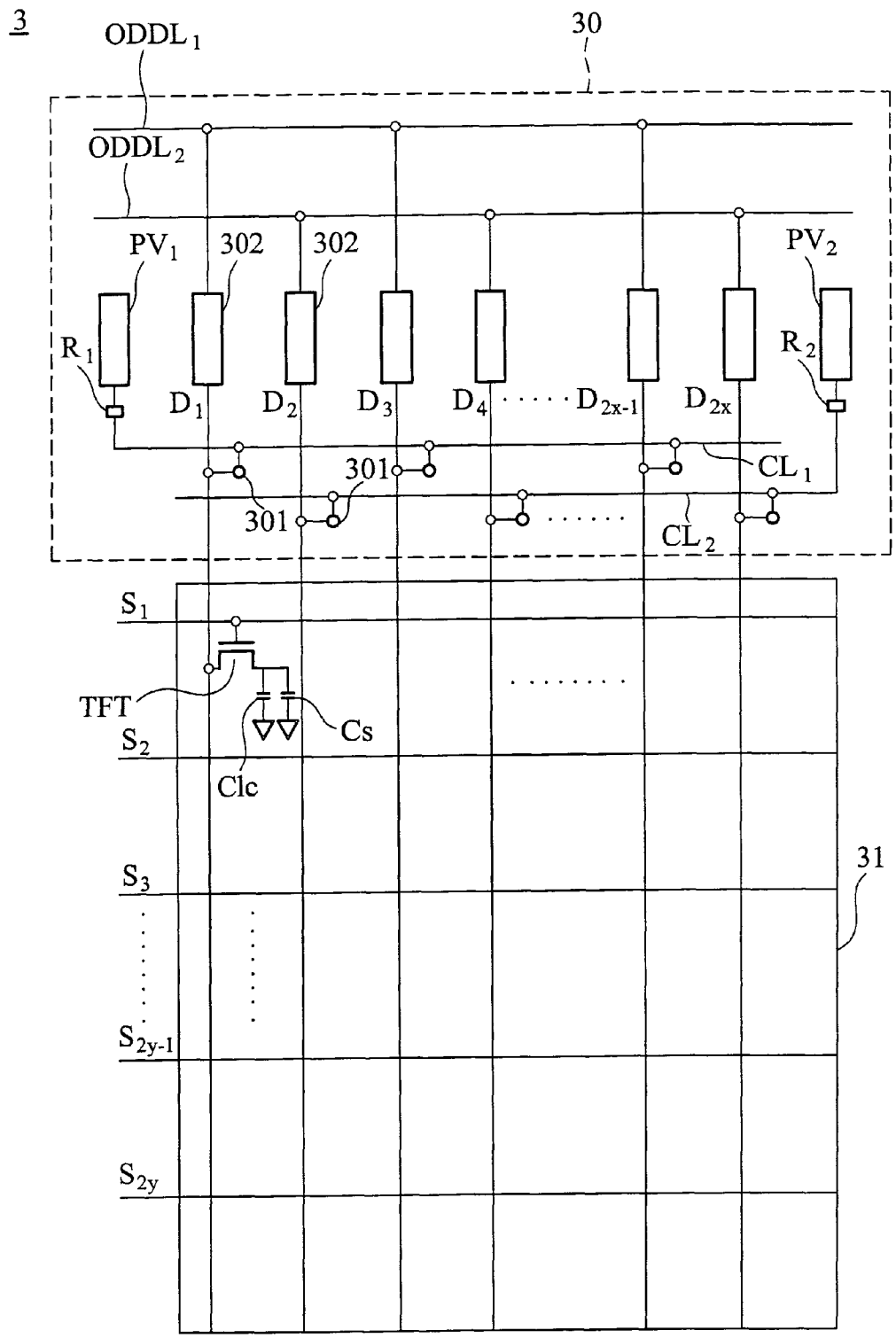
FIGS. 3 and 4 depict an embodiment of a display panel.

Display panels are provided. In some embodiments, as shown in FIG. 3, a display panel 3 comprises a test circuit 30 and a display array 31 configured on a glass substrate. Since the display array 31 in FIG. 3 is the same as the display array 1 in FIG. 1, like reference numbers are used to designate like parts, and descriptions of the like parts are omitted here. In the embodiment of FIG. 3, the display array 31 is formed by interlacing data lines $D_1$ to $D_{2x}$ and scan lines $G_1$ to $G_{2y}$. The data lines $D_1$ to $D_{2x}$ are divided into two groups, one comprising the odd-numbered data lines $D_1$ to $D_{2x-1}$, and the other comprising the even-numbered data lines $D_2$ to $D_{2x}$. The test circuit 30 comprises an odd-numbered detecting line $ODDL_1$, an even-numbered detecting line $EDDL_1$, a plurality of electrostatic discharge (ESD) protection circuits 301, and a plurality of data pads 302. The odd-numbered data lines $D_1$ to $D_{2x-1}$ are coupled to the odd-numbered detecting line $ODDL_1$ through corresponding data pads 302, and the even-numbered data lines $D_2$ to $D_{2x}$ are coupled to the even-numbered detecting line $EDDL_1$ through corresponding data pads 302.

Each ESD protection circuit 301 is coupled between the odd-numbered data lines $D_1$ to $D_{2x-1}$ and a common electrode line $CL_1$ or between the even-numbered data lines $D_2$ to $D_{2x}$ and a common electrode line $CL_2$. Note that the common electrode lines $CL_1$ and $CL_2$ are coupled to different common voltage ports. As shown in FIG. 3, the common electrode line $CL_1$ is coupled to a common voltage port $PV_1$, while the common electrode line $CL_2$ is coupled to a common voltage port $PV_2$.

In the embodiment of FIG. 3, a high impedance element $R_1$ is coupled between the common electrode line $CL_1$ and the common voltage port $PV_1$, and a high impedance element $R_2$ is coupled between the common electrode line $CL_2$ and the common voltage port $PV_2$.

On the glass substrate, the common voltage ports $PV_1$ and $PV_2$ are different, that is, the common voltage ports $PV_1$ and $PV_2$ are not coupled on the glass substrate. Thus, in a test process, respective test signals provided to the odd-numbered data lines $D_1$ to $D_{2x-1}$ and the even-numbered data lines $D_2$ to $D_{2x}$ do not interfere with each other.

Figure 4:
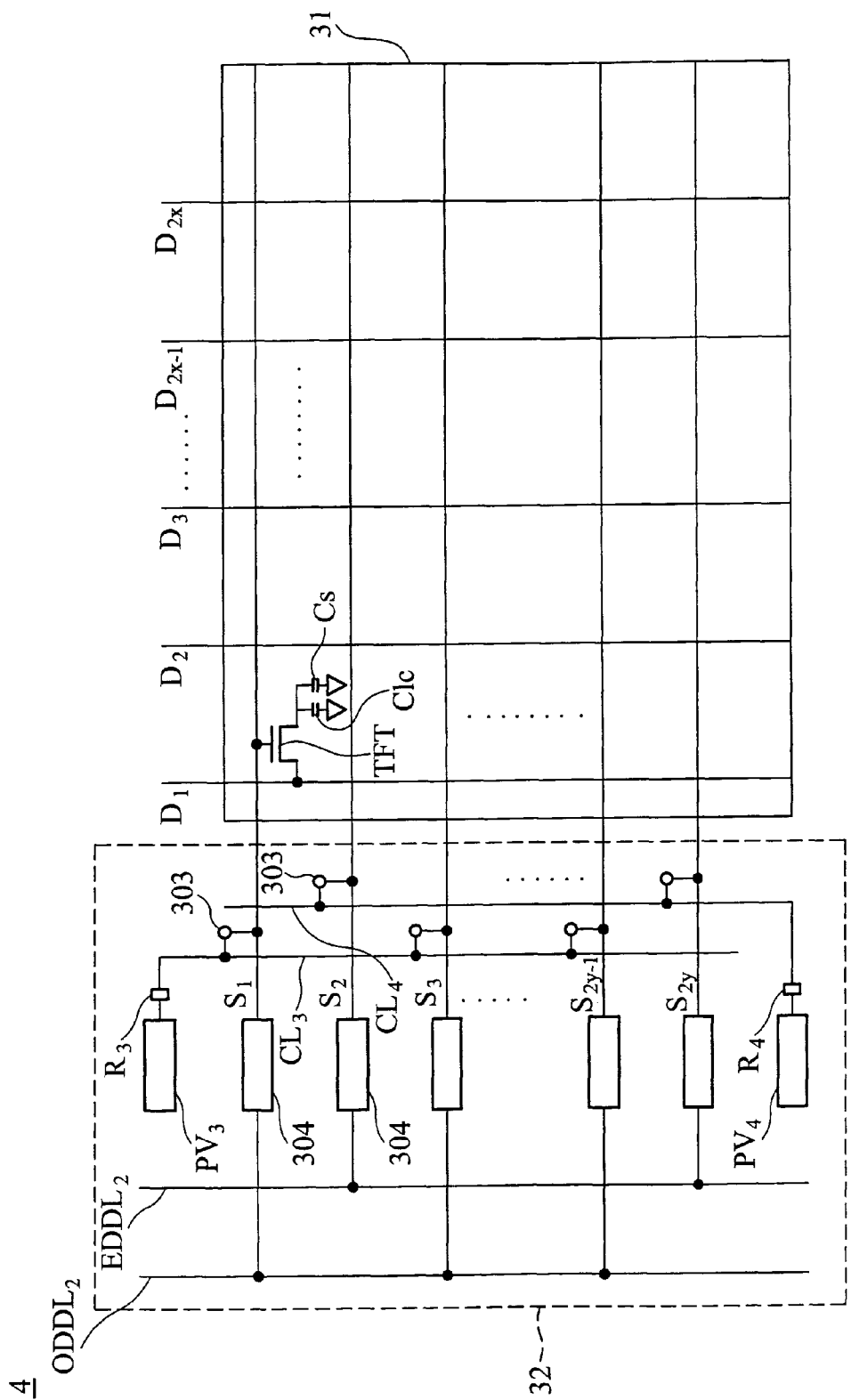

Referring to FIG. 4, the display panel 3 further comprises a test circuit 32 for testing the scan lines $S_1$ to $S_{2y}$. For clarity, FIG. 4 shows only the test circuit 32 and the display array 31, and the test circuit 30 is omitted. Referring FIG. 4, the scan lines $S_1$ to $S_{2y}$ are divided into two groups, one comprising the odd-numbered scan lines $S_1$ to $S_{2y-1}$, and the other comprising the even-numbered scan lines $S_2$ to $S_{2y}$. The test circuit 32 comprises an odd-numbered detecting line $ODDL_2$, an even-numbered detecting line $EDDL_2$, a plurality of ESD protection circuits 303, and a plurality of scan pad 304. The odd-numbered scan lines $S_1$ to $S_{2y-1}$ are coupled to the odd-numbered detecting line $ODDL_2$ through corresponding scan pads 304, and the even-numbered scan lines $S_2$ to $S_{2y}$ are coupled to the even-numbered detecting line $EDDL_2$ through corresponding scan pads 304.

Each ESD protection circuit 303 is coupled between the odd-numbered scan lines $S_1$ to $S_{2y-1}$ and a common electrode line $CL_3$ or between the even-numbered scan lines $S_2$ to $S_y$, and a common electrode line $CL_4$. Note that the common electrode lines $CL_3$ and $CL_4$ are coupled to different common voltage ports. As shown in FIG. 4, the common electrode line $CL_3$ is coupled to a common voltage port $PV_3$, while the common electrode line $CL_4$ is coupled to a common voltage port $PV_4$.

In the embodiment of FIG. 4, a high impedance element $R_3$ is coupled between the common electrode line $CL_3$ and the common voltage port $PV_3$, and a high impedance element $R_4$ is coupled between the common electrode line $CL_4$ and the common voltage port $PV_4$.

On the glass substrate, the common voltage ports $PV_3$ and $PV_4$ are different, that is, the common voltage ports $PV_3$ and $PV_4$ are not coupled on the glass substrate. Thus, in a test process, respective test signals provided to the odd-numbered scan lines $S_1$ to $S_{2y-1}$ and the even-numbered scan lines $S_2$ to $S_{2y}$ do not interfere with each other.

Figure 5:
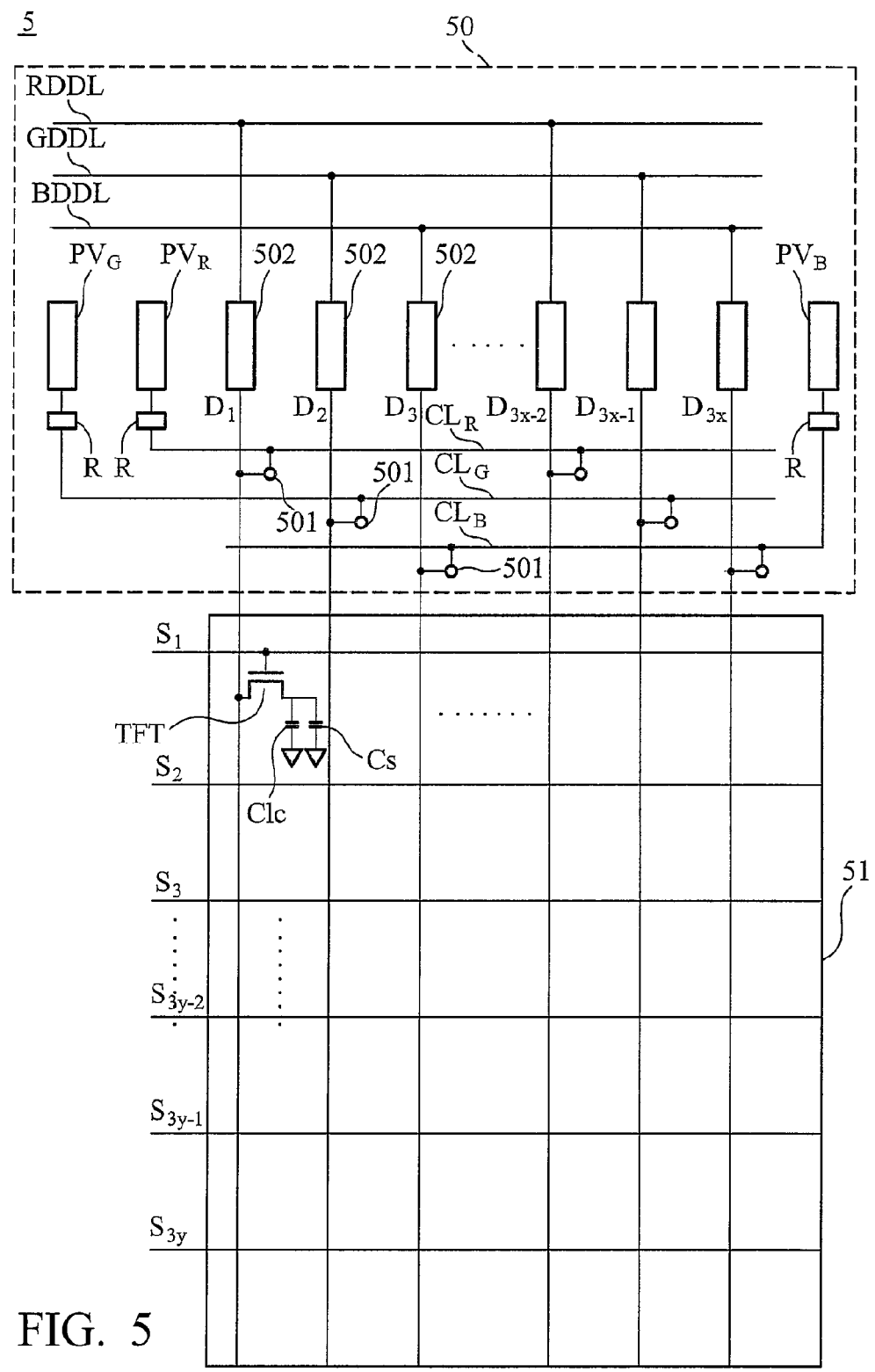
FIG. 5 depicts an embodiment of a display panel.

In some embodiments, as shown in FIG. 5, a display panel 5 comprises a test circuit 50 and a display array 51 configured on a glass substrate. Since the display array 51 in FIG. 5 is the same as the display array 1 in FIG. 1, like reference numbers are used to designate like parts, and the description of like parts are omitted here. In the embodiment of FIG. 5, the display array 51 is formed by interlacing data lines $D_1$ to $D_{3x}$ and scan lines $G_1$ to $G_{23}$. According to the three primary colors, red (R) green (G), and blue (B), the data lines $D_1$ to $D_{3x}$ are divided into three groups, one comprising red data lines $D_1$ to $D_{3x-2}$, another comprising green data lines $D_2$ to $D_{3x-1}$, and another comprising blue data lines $D_3$ to $D_{3x}$. The test circuit 50 comprises a red detecting line RDDL, green detecting line GDDL, a blue detecting line BDDL, a plurality of ESD protection circuits 501, and a plurality of data pad 502. The red data lines $D_1$ to $D_{3x-2}$ are coupled to the red detecting line RDDL through corresponding data pads 502, the green data lines $D_2$ to $D_{3x-1}$ are coupled to the green detecting line GDDL through corresponding data pads 502, and the blue data lines $D_3$ to $D_{3x}$ are coupled to the blue detecting line BDDL through corresponding data pads 502.

Each ESD protection circuit 501 is coupled between the red data lines $D_1$ to $D_{3x-2}$ and a common electrode line $CL_R$, between the green data lines $D_2$ to $D_{3x-1}$ and a common electrode line $CL_G$, or between the blue data lines $D_3$ to $D_{3x}$ and a common electrode line $CL_B$. Note that the common electrode lines $CL_R$, $CL_G$, and $CL_B$ are coupled to different common voltage ports. As shown in FIG. 5, the common electrode line $CL_R$ is coupled to a common voltage port $PV_R$, the common electrode line $CL_G$ is coupled to a common voltage port $PV_G$, and the common electrode line $CL_B$ is coupled to a common voltage port $PV_B$.

In the embodiment of FIG. 5, a high impedance element R is coupled between each common electrode line and the corresponding common voltage port.

On the glass substrate, the common voltage ports $PV_R$, $PV_G$, and $PV_B$ are different, that is, the common voltage ports $PV_R$, $PV_G$, and $PV_B$ are not coupled on the glass substrate. Thus, in a test process, respective test signals provided to the red data lines $D_1$ to $D_{3x-2}$, the green data lines $D_2$ to $D_{3x-1}$, and the blue data lines $D_3$ to $D_{3x}$ do not interfere with each other.

In the embodiment of FIG. 5, a test circuit (not shown) for scan lines $S_1$ to $S_{2y}$ is the same as the test current 32 in FIG. 4. Thus, the connection between the scan lines $S_1$ to $S_{2y}$ and the corresponding test circuit refers to the description of FIG. 4 and further description is omitted here.

In the invention, according to system requirements, signal lines (data lines or scan lines) can be divided into a plurality of groups for testing. Each group of signal lines is coupled to one common electrode line. Since each common electrode line is coupled to a respective common voltage port on a glass substrate, test signals on the plurality of common electrode lines do not interfere with each other. Moreover, the plurality of common voltage ports are not connected on the glass substrate, but in the printed circuit board (PCB) or flexible printed circuit (FPC) outside the glass substrate.

While the invention has been described in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A display panel comprising:
   a plurality of first data lines arranged in parallel;
   a plurality of second data lines arranged in parallel, alternately configured with the first data lines;
   a plurality of first scan lines arranged in parallel and interlaced with the first and second data lines;
   a plurality of second scan lines arranged in parallel, alternately configured with the first scan lines and interlaced with the first and second data lines;
   a first detecting line coupled to the first data lines for testing the first data lines;
   a second detecting line coupled to the second data lines for testing the second data lines;
   a third detecting line coupled to the first scan lines for testing the first scan lines;
   a fourth detecting line coupled to the second scan lines for testing the second scan lines;
   a plurality of first electrostatic discharge (ESD) protection circuits, each coupled to one of the first data lines or one of the second data lines;
   a plurality of second electrostatic discharge (ESD) protection circuits, each coupled to one of the first scan lines or one of the second scan lines;
   a first common electrode line having a first voltage port, wherein each first data line is coupled to the first common electrode line through the corresponding first ESD protection circuit;
   a second common electrode line having a second voltage port, wherein each second data line is coupled to the second common electrode line through the corresponding first ESD protection circuit;

a third common electrode line having a third voltage port, wherein each first scan line is coupled to the third common electrode line through the corresponding second ESD protection circuit; and a fourth common electrode line having a fourth voltage port, wherein each second scan line is coupled to the fourth common electrode line through the corresponding second ESD protection circuit;

wherein the first common electrode line and the second common electrode line are not directly connected to the third common electrode line and the fourth common electrode line, and the first, second, third and fourth common electrode lines are not directly connected to each other.

2. The display panel as claimed in claim 1, wherein the first voltage port and the second voltage port are electrically connected to one common voltage source, independently.

3. The display panel as claimed in claim 1, further comprising:
 a first impedance element coupled between the first common electrode line and the first voltage port;
 a second impedance element coupled between the second common electrode line and the second voltage port;
 a third impedance element coupled between the third common electrode line and the third voltage port; and
 a fourth impedance element coupled between the fourth common electrode line and the fourth voltage port.

4. The display panel as claimed in claim 1, further comprising a plurality of first pads and a plurality of second pads, wherein the first detecting line coupled to the first data lines through the first pads and the second detecting line coupled to the second data lines through the second pads.

5. The display panel as claimed in claim 1, further comprising a plurality of third pads and a plurality of fourth pads, wherein the third detecting line coupled to the first scan lines through the third pads and the fourth detecting line coupled to the second scan lines through the fourth pads.

6. The display panel as claimed in claim 1, wherein the first data lines and the second data lines are odd data lines and even data lines, respectively, and the first scan lines and the second scan lines are odd scan lines and even scan lines, respectively.

7. A display panel comprising:
 a plurality of first data lines, a plurality of second data line and a plurality of third data lines, alternately configured and arranged in parallel;
 a plurality of first scan lines and a plurality of second scan lines; alternately configured and arranged in parallel, and interlaced with the first data lines, second data lines and third data lines;
 a first detecting line coupled to the first data lines for testing the first data lines;
 a second detecting line coupled to the second data lines for testing the second data lines;
 a third detecting line coupled to the third data lines for testing the third data lines;
 a fourth detecting line coupled to the first scan lines for testing the first scan lines;
 a fifth detecting line coupled to the second scan lines for testing the second scan lines;
 a plurality of first electrostatic discharge (ESD) protection circuits, each coupled to one of the first data lines, second data lines, and third data lines;
 a plurality of second electrostatic discharge (ESD) protection circuits, each coupled to one of the first scan lines and second scan lines;
 a first common electrode line having a first voltage port, wherein each first data line is coupled to the first common electrode line through the corresponding first ESD protection circuit;
 a second common electrode line having a second voltage port, wherein each second data line is coupled to the second common electrode line through the corresponding first ESD protection circuit;
 a third common electrode line having a third voltage port, wherein each third data line is coupled to the third common electrode line through the corresponding first ESD protection circuit;
 a fourth common electrode line having a fourth voltage port, wherein each first scan line is coupled to the fourth common electrode line through the corresponding second ESD protection circuit; and
 a fifth common electrode line having a fifth voltage port, wherein each second scan line is coupled to the fifth common electrode line through the corresponding second ESD protection circuit;
 wherein the first common electrode line, the second common electrode line and the third common electrode line are not directly connected to the fourth common electrode line and the fifth common electrode line, and the first, second, third, fourth and fifth common electrode lines are not directly connected to each other.

8. The display panel as claimed in claim 7, wherein the first, second, and third data lines are divided according to three primary colors.

9. The display panel as claimed in claim 8, wherein the three primary colors comprises red, green, and blue.

10. The display panel as claimed in claim 7, wherein the first voltage port, the second voltage port, the third voltage port, the fourth voltage port and the fifth voltage port are electrically connected to one common voltage source, independently.

11. The display panel as claimed in claim 7, further comprising:
 a first impedance element coupled between the first common electrode line and the first voltage port;
 a second impedance element coupled between the second common electrode line and the second voltage port;
 a third impedance element coupled between the third common electrode line and the third voltage port;
 a fourth impedance element coupled between the fourth common electrode line and the fourth voltage port; and
 a fifth impedance element coupled between the fifth common electrode line and the fifth voltage port.

12. The display panel as claimed in claim 7, further comprising a plurality of first pads, a plurality of second pads and a plurality of third pads, wherein the first detecting line, the second detecting line and the third detecting line coupled to the first data lines, the second data lines and the third data lines through the first pads, the second pads and the third pads, respectively.

13. The display panel as claimed in claim 7, further comprising a plurality of fourth pads and a plurality of fifth pads, wherein the fourth detecting line coupled to the first scan lines through the fourth pads and the fifth detecting line coupled to the second scan lines through the fifth pads.

* * * * *